(12) United States Patent
Takahashi et al.

(10) Patent No.: US 9,401,305 B2
(45) Date of Patent: Jul. 26, 2016

(54) AIR GAPS STRUCTURES FOR DAMASCENE METAL PATTERNING

(71) Applicant: SanDisk Technologies Inc., Plano, TX (US)

(72) Inventors: Yuji Takahashi, Yokkaichi (JP); Takuya Futase, Nagoya (JP); Yoko Furihata, Yokkaichi (JP); Satoshi Kamata, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/533,839

(22) Filed: Nov. 5, 2014

(65) Prior Publication Data

US 2016/0126130 A1    May 5, 2016

(51) Int. Cl.
| | | |
|---|---|---|
| *H01L 21/8239* | (2006.01) | |
| *H01L 21/764* | (2006.01) | |
| *H01L 21/768* | (2006.01) | |
| *H01L 23/522* | (2006.01) | |
| *H01L 23/528* | (2006.01) | |
| *H01L 23/532* | (2006.01) | |
| *H01L 27/115* | (2006.01) | |
| *H01L 21/311* | (2006.01) | |
| *H01L 21/8247* | (2006.01) | |

(52) U.S. Cl.
CPC ...... *H01L 21/7682* (2013.01); *H01L 21/31111* (2013.01); *H01L 21/7684* (2013.01); *H01L 21/76802* (2013.01); *H01L 21/76829* (2013.01); *H01L 21/76843* (2013.01); *H01L 21/76877* (2013.01); *H01L 23/528* (2013.01); *H01L 23/5226* (2013.01); *H01L 23/5329* (2013.01); *H01L 23/53223* (2013.01); *H01L 23/53238* (2013.01); *H01L 23/53266* (2013.01); *H01L 27/1157* (2013.01); *H01L 27/11524* (2013.01)

(58) Field of Classification Search
CPC . H01L 21/764; H01L 21/768; H01L 21/7682; H01L 21/76289; H01L 21/76264; H01L 21/76804–21/76816
See application file for complete search history.

(56) References Cited

U.S. PATENT DOCUMENTS

| | | | | |
|---|---|---|---|---|
| 6,423,630 | B1 * | 7/2002 | Catabay | H01L 21/7682 257/E21.576 |
| 7,208,361 | B2 * | 4/2007 | Shah | H01L 21/84 257/204 |
| 7,692,304 | B2 * | 4/2010 | Fukumoto | H01L 21/31111 257/758 |
| 7,732,275 | B2 * | 6/2010 | Orimoto | H01L 27/115 257/E21.179 |
| 7,737,015 | B2 | 6/2010 | Kohli et al. | |
| 7,795,080 | B2 | 9/2010 | Orimoto et al. | |
| 7,800,155 | B2 | 9/2010 | Matsuno | |
| 7,803,683 | B2 * | 9/2010 | Nishimura | H01L 21/76804 438/212 |
| 7,863,190 | B1 | 1/2011 | Papasouliotis | |
| 7,884,415 | B2 | 2/2011 | Nagano | |
| 7,905,959 | B2 | 3/2011 | Tzu et al. | |
| 7,923,767 | B2 * | 4/2011 | Higashitani | H01L 21/76232 257/314 |

(Continued)

*Primary Examiner* — WIlliam F Kraig
*Assistant Examiner* — Maliheh Malek
(74) *Attorney, Agent, or Firm* — Davis Wright Tremaine LLP

(57) ABSTRACT

A pattern of parallel lines defines first regions where no conductive material is to be located, a distance between adjacent lines in the first regions being smaller than a predetermined distance, and defines second regions where conductive material is to be located, a distance between adjacent lines in the second regions being larger than the predetermined distance. A subsequent layer caps air gaps between lines in the first regions. Conductive material is then deposited and planarized to form lines of conductive material in the second regions.

15 Claims, 10 Drawing Sheets

(56) References Cited

U.S. PATENT DOCUMENTS

| | | |
|---|---|---|
| 8,053,347 B2 | 11/2011 | Kang et al. |
| 8,129,264 B2 | 3/2012 | Kim et al. |
| 8,362,542 B2 | 1/2013 | Kang et al. |
| 8,383,479 B2 | 2/2013 | Purayath |
| 8,492,224 B2 | 7/2013 | Purayath et al. |
| 8,546,239 B2 | 10/2013 | Harari et al. |
| 8,603,890 B2 | 12/2013 | Purayath et al. |
| 9,177,853 B1* | 11/2015 | Futase .................. H01L 21/64 |
| 2002/0060354 A1* | 5/2002 | Nakagawa .......... H01L 21/7682 257/618 |
| 2006/0194390 A1 | 8/2006 | Imai et al. |
| 2007/0184615 A1 | 8/2007 | Brazzelli et al. |
| 2007/0246831 A1* | 10/2007 | Gabric ................ H01L 21/7682 257/758 |
| 2007/0257305 A1 | 11/2007 | Sasago et al. |
| 2008/0003743 A1 | 1/2008 | Lee |
| 2008/0029841 A1* | 2/2008 | Feng .................. H01L 21/7682 257/522 |
| 2008/0283898 A1 | 11/2008 | Kuniya |
| 2009/0081862 A1* | 3/2009 | Chen ................ H01L 21/76831 438/618 |
| 2009/0206391 A1* | 8/2009 | Ando ................ H01L 21/76229 257/324 |
| 2009/0212352 A1 | 8/2009 | Aoyama et al. |
| 2009/0267131 A1 | 10/2009 | Nitta |
| 2009/0298256 A1* | 12/2009 | Chen .................. H01L 21/7682 438/421 |
| 2010/0019311 A1 | 1/2010 | Sato et al. |
| 2010/0093168 A1* | 4/2010 | Naik ................ H01L 21/31144 438/618 |
| 2010/0127320 A1 | 5/2010 | Nishihara et al. |
| 2010/0190337 A1* | 7/2010 | Lee .................... H01L 21/7682 438/666 |
| 2010/0230741 A1 | 9/2010 | Choi et al. |
| 2010/0283053 A1* | 11/2010 | Clark ................ H01L 27/1021 257/49 |
| 2010/0301489 A1* | 12/2010 | Seidel ............... H01L 21/76804 257/773 |
| 2011/0057250 A1 | 3/2011 | Higashi |
| 2011/0303967 A1 | 12/2011 | Harari et al. |
| 2011/0309430 A1 | 12/2011 | Purayath et al. |
| 2012/0038056 A1* | 2/2012 | Cabral, Jr. .......... H01L 21/31116 257/774 |
| 2012/0058639 A1* | 3/2012 | Sim .................... H01L 21/7682 438/666 |
| 2012/0070976 A1* | 3/2012 | Kim ...................... H01L 21/764 438/594 |
| 2012/0112269 A1* | 5/2012 | Kim .................. H01L 21/76897 257/330 |
| 2012/0126302 A1* | 5/2012 | Noda .................... H01L 21/764 257/315 |
| 2012/0168899 A1* | 7/2012 | Kim .................... H01L 21/7682 257/522 |
| 2012/0199938 A1* | 8/2012 | Hwang ............... H01L 21/7682 257/506 |
| 2012/0241838 A1* | 9/2012 | Nagashima ........ H01L 27/11524 257/316 |
| 2013/0207267 A1* | 8/2013 | Rho .................. H01L 21/76846 257/751 |
| 2013/0228934 A1* | 9/2013 | Kim ...................... H01L 23/481 257/774 |
| 2013/0267088 A1* | 10/2013 | Baek ................ H01L 21/76802 438/637 |
| 2014/0061757 A1* | 3/2014 | Kim .................. H01L 29/42332 257/316 |
| 2014/0232000 A1* | 8/2014 | Huang ............... H01L 21/76885 257/761 |
| 2014/0361403 A1* | 12/2014 | Cho .................... H01L 21/764 257/532 |
| 2015/0028492 A1* | 1/2015 | Jung .................. H01L 21/7682 257/774 |
| 2015/0076708 A1* | 3/2015 | Kaneko ................ H01L 21/764 257/774 |
| 2015/0091127 A1* | 4/2015 | Lee .................... H01L 29/0649 257/506 |
| 2015/0091186 A1* | 4/2015 | Yang ...................... H01L 23/481 257/774 |
| 2015/0179661 A1* | 6/2015 | Huo ...................... H01L 21/764 257/57 |
| 2015/0194333 A1* | 7/2015 | You .................... H01L 21/7682 438/619 |
| 2015/0228531 A1* | 8/2015 | Tagami ............... H01L 21/7682 257/773 |
| 2015/0311112 A1* | 10/2015 | Fukuo ............... H01L 21/76802 257/773 |
| 2015/0318298 A1* | 11/2015 | Matsudaira ....... H01L 27/11556 257/314 |
| 2015/0332953 A1* | 11/2015 | Futase ............... H01L 21/7682 438/421 |
| 2015/0357189 A1* | 12/2015 | Davis ............... H01L 21/28512 257/29 |

* cited by examiner

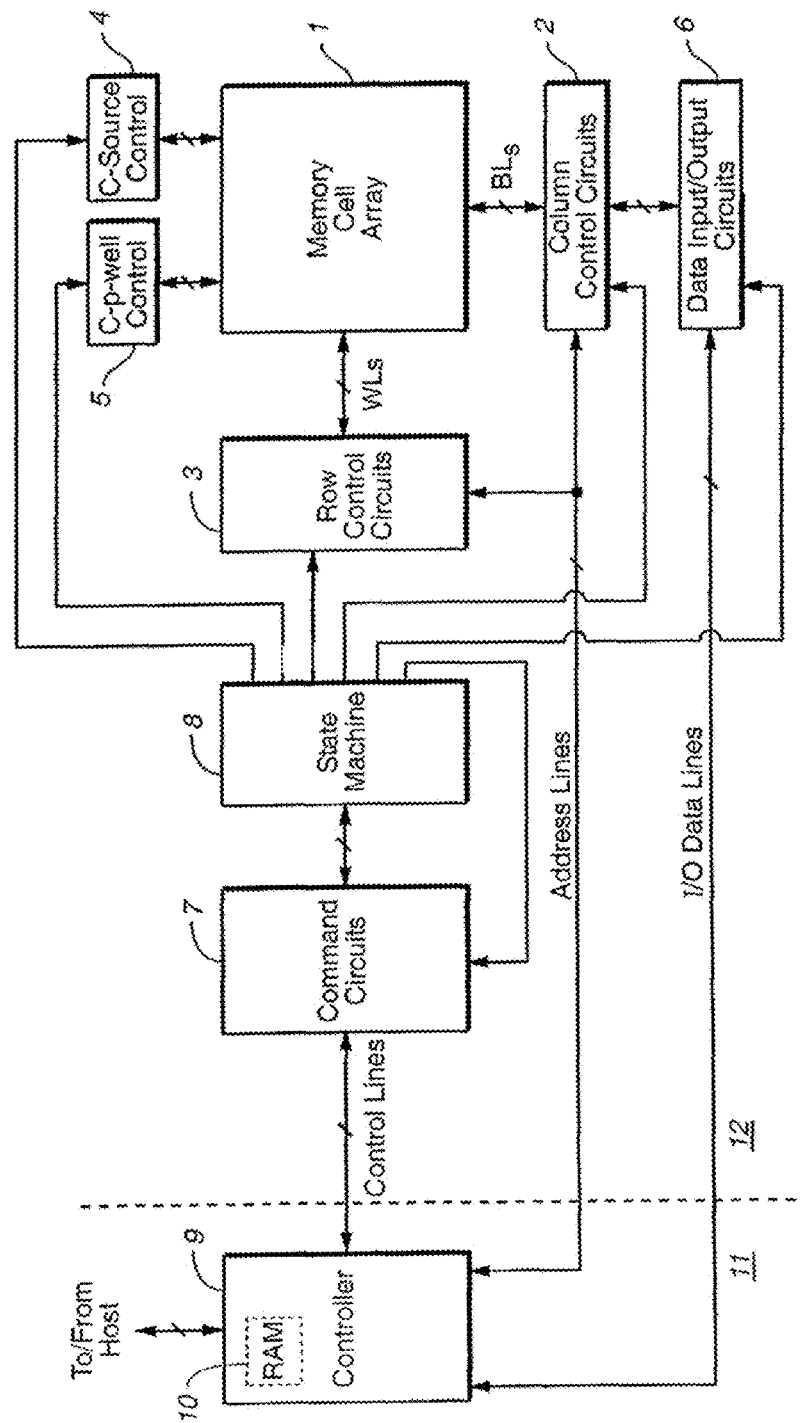
FIG._1
*(Prior Art)*

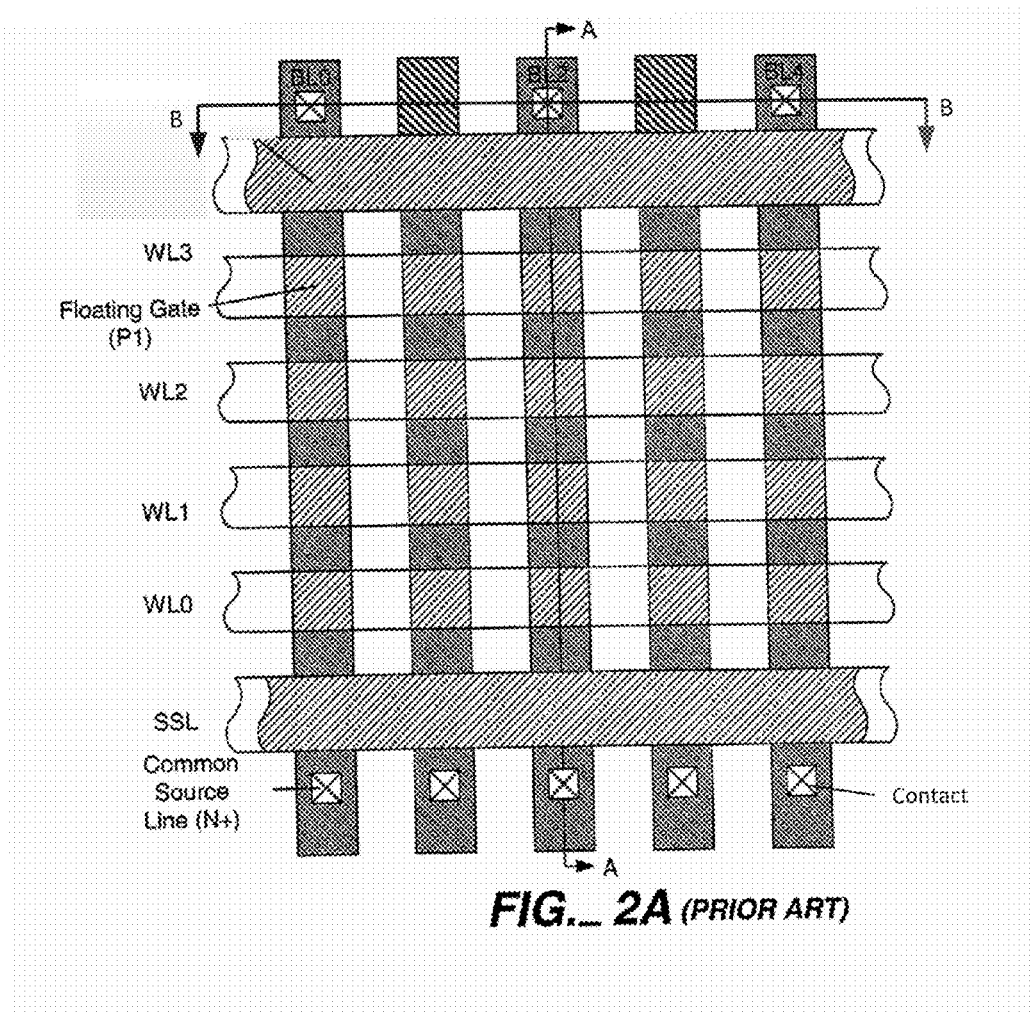
FIG.__2A (PRIOR ART)
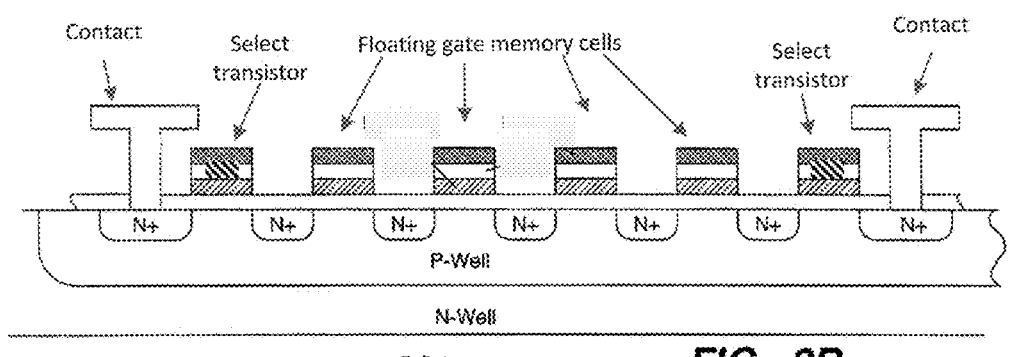
FIG.__2B (PRIOR ART)
(Section A-A)

(Section B-B)

AIR GAPS STRUCTURES FOR DAMASCENE METAL PATTERNING

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contact plugs (or "vias") may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal to form vias. Metal lines, such as bit lines, extend over the memory array and in peripheral areas in order to connect the memory array and various peripheral circuits. Electrical contact between metal lines and vias occurs where horizontal metal lines intersect vertical contact plugs. These metal lines may be close together (particularly in the memory array area where bit lines may be very close) which tends to make processing difficult and provides a risk of capacitive coupling. The characteristics of such lines (e.g. resistance and coupling) and the quality of connections with vias may be significant factors for good memory operation.

Thus, there is a need for a memory chip manufacturing process that forms uniform low resistance conductive lines, such as bit lines, in close proximity in an efficient manner.

SUMMARY

According to an example of formation of a memory integrated circuit, air gap structures for bit line isolation are formed prior to deposition of bit line metal. Instead of forming bit lines and then removing material between bit lines to form air gaps, air gap structures may already be in place before bit lines are formed. Air gaps may be formed by sidewall spacers that are formed along sides of sacrificial mandrels. After sacrificial mandrels are removed, the air gaps are capped by a capping layer that has a high deposition rate over sidewall spacers. Narrow air gap structures that include a single air gap may separate bit lines. Larger air gap structures that include two or more air gaps may also be formed using the same process steps.

An example of a method of forming air gaps in an integrated circuit includes: forming a plurality of parallel lines of dielectric of equal height on a first layer of dielectric; the plurality of parallel lines defining first regions where no conductive material is to be located, a distance between adjacent lines in the first regions being smaller than a predetermined distance; the plurality of parallel lines defining second regions where conductive material is to be located, a distance between adjacent lines in the second regions being larger than the predetermined distance; subsequently, depositing a second layer that caps air gaps between lines in the first regions that are less than the predetermined distance apart and that deposits the second layer on the first layer of dielectric in the second regions where adjacent lines are more than the predetermined distance apart; subsequently removing the second layer in the second regions to expose the surface of the first layer; subsequently depositing barrier metal and conductive material across the first and second regions; and subsequently planarizing to expose the second layer in the first regions and to form individual lines of conductive material in the second regions.

The method of may also include: forming a third layer on the first layer of dielectric, the third layer formed of a material with a lower etching rate than the first layer; patterning the third layer to form core portions; depositing a fourth layer on top surfaces of the core portions, side walls of the core portions, and on a surface of the first layer; etching back the fourth layer to remove the fourth layer from the top surfaces of the core portions to expose the top surfaces of the core portions and to remove the fourth layer from the surface of the first layer; and removing the core portions while maintaining the fourth layer that was deposited on the sidewalls of the core portions. The core portions may have a tapered shape with bottom surface in contact with the first layer of dielectric, the bottom surface being wider than the top surface. The forming of the plurality of parallel lines may include: forming a third layer on the first layer of dielectric; forming a mask pattern on the third layer using a lithography process; and forming the plurality of line patterns from the third layer by patterning the third layer using the mask pattern and an anisotropic etch process. The second layer may have a first thickness in the first regions and a second thickness in the second regions, the first thickness being greater than the second thickness. The barrier metal may be a metal that has a significant etch rate when etching dielectric material. The barrier metal may be titanium. The planarizing may expose the second layer in the first regions where the second layer overlies air gaps, and the planarizing may not expose the air gaps.

An example of a method of forming metal lines in an integrated circuit includes: forming a plurality of air gap mandrels on a dielectric layer; forming sidewalls on the plurality of air gap mandrels; subsequently, removing the plurality of air gap mandrels; subsequently, depositing a capping layer to enclose a plurality of air gaps where the plurality of air gap mandrels were removed; and subsequently depositing bit line metal to form a plurality of bit lines at locations between the plurality of air gaps.

Large areas without metal may be formed by forming a plurality of elongated closely-spaced air gap mandrels in the large areas so that the capping layer forms a continuous covering over tops of sidewalls formed on the plurality of elongated closely-spaced air gap mandrels. Additional air gaps in the large areas may be enclosed, the additional air gaps formed between sidewalls formed on neighboring mandrels of the plurality of elongated closely-spaced air gap mandrels. Prior to depositing the bit line metal, the capping layer may be etched back to remove the capping layer at locations where the capping layer is in contact with the dielectric layer without exposing the plurality of air gaps or the additional air gaps. The bit line metal may be planarized to separate bit lines at locations between the plurality of air gaps. The planarizing may stop at a level above the plurality of air gaps so that air gaps remain enclosed. The plurality of air gap mandrels may be formed of a sacrificial material and may be removed using an etch that is selective to the sacrificial material, the etch having a higher etch rate for the sacrificial material than for material of the sidewalls and material of the dielectric layer.

An example of a structure includes: a NAND memory array; a dielectric layer overlying the NAND memory array; a plurality of vias extending through the NAND memory array; a plurality of bit lines extending on a surface of the dielectric layer, each of the plurality of bit lines formed of metal that electrically contacts a corresponding via of the plurality of vias; a plurality of enclosed air gaps extending on the surface of the dielectric layer, an individual enclosed air gap located between neighboring bit lines; and a large air gap structure comprising a plurality of isolated air gaps extending on the surface of the dielectric layer.

The individual enclosed air gap may be defined by a first sidewall and a second sidewall located on the surface of the dielectric layer and a capping portion that extends from the first sidewall to the second sidewall and that overlies the air gap. The first sidewall may extend parallel to the second sidewall along the surface of the dielectric layer and may be less than a threshold distance from the second sidewall. The large air gap structure may include four or more parallel sidewall spacers that are spaced apart by less than the threshold distance. The large air gap structure may also include a large capping portion that extends over the four or more sidewall spacers and over the plurality of isolated air gaps that are formed between the four or more parallel sidewall spacers.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2A is a plan view of a prior art NAND array.
FIG. 2B shows a cross section of the NAND array of FIG. 2A.

DETAILED DESCRIPTION OF EXEMPLARY EMBODIMENTS

Memory System

Figure 2C:
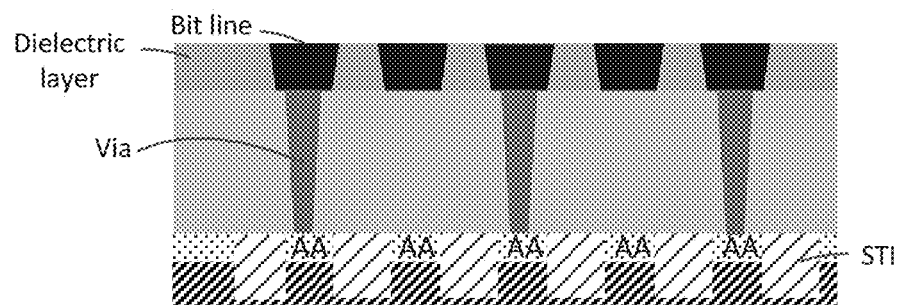
FIG. 2C shows another cross section of the NAND array of FIG. 2A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use non-volatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias, are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal contact plugs extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the plane of the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible.

As memories become smaller, the spacing between bit lines tends to diminish. Accordingly, capacitive coupling between bit lines tends to increase as technology progresses to ever-smaller dimensions. FIG. 2C shows an example of bit lines formed in a dielectric material. For example, copper bit lines may be formed by a damascene process in which elongated openings, or trenches, are formed in the dielectric layer and then copper is deposited to fill the trenches. When excess copper is removed (e.g. by Chemical Mechanical Polishing, CMP) copper lines remain. A suitable dielectric may be chosen to keep bit line-to-bit line capacitance low.

One way to reduce bit line-to-bit line coupling is to provide an air gap between neighboring bit lines. Thus, rather than maintain dielectric portions between bit lines, the bit lines are formed in a sacrificial layer which is then removed to leave air gaps between bit lines.

Removing sacrificial material between bit lines generally requires some form of etching which may expose bit lines to etch-related damage. While a suitable combination of sacrificial material and etch chemistry may be chosen so that sacrificial material is etched at a higher rate than bit line metal and/or barrier material, some etching or corrosion of bit line metal and/or barrier metal may occur and bit lines may be damaged accordingly.

Figure 3:
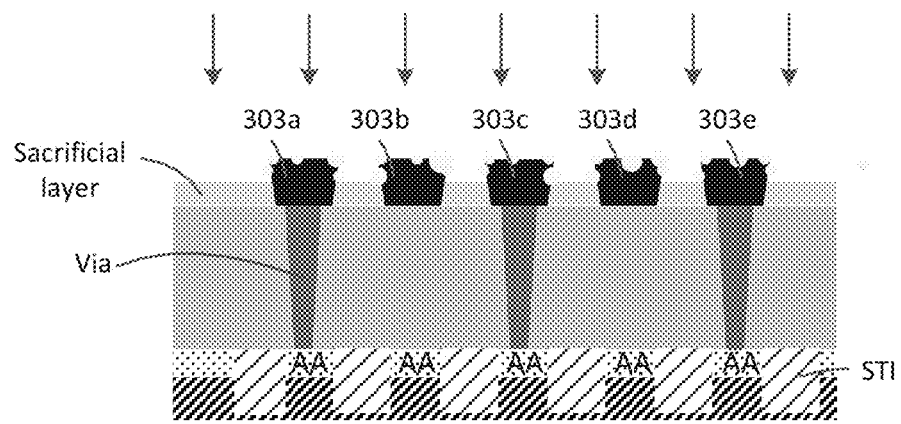
FIG. 3 illustrates an example of formation of air gaps between bit lines.

FIG. 3 shows formation of air gaps between bit lines 303a-e by etching away the sacrificial material between bit lines. Such etching may expose bit lines to etch damage (i.e. bit line materials such as copper, and barrier layer materials such as titanium may be corroded or removed by such etching). Damaged bit lines may provide higher resistance or may be shorted out if they are etched through. In addition, over-etching in such a step may undercut bit lines so that the bit lines are no longer attached and may lift off from the substrate resulting in failure. To avoid such over-etching, the etch depth may be reduced which may lead to a significant amount of dielectric remaining between bit lines with the result that coupling is not reduced as much as if the air gap extended further.

Examples presented here form bit lines using a damascene process in which air gap structures are formed before bit line material is deposited. These air gap structures provide a pattern for damascene metal patterning. However, unlike a sacrificial layer, they remain in place so that no etching is required after bit lines are formed and thus the bit lines are not exposed to damaging etching.

Figure 4:
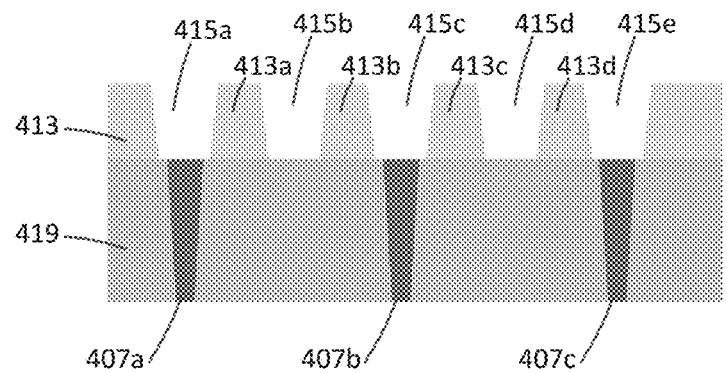
FIGS. 4 shows a cross section of a portion of a NAND memory die at an intermediate stage of fabrication including mandrels.

FIG. 4 shows an example of a portion of a memory die at an intermediate stage of fabrication with vias 407a-c extending through dielectric layer 419. Underlying structures such as STI portions and active areas are omitted from this and subsequent figures for clarity. It will be understood that any suitable circuits, including planar NAND flash memory, may underlie the portions shown. A sacrificial layer 413 extends over dielectric layer 419 and is patterned into mandrels 413a-d that are used as sacrificial core portions to form air gap structures. Mandrels 413a-e are separated by trenches 415a-e. Mandrels 413a-e extend in the direction perpendicular to the plane shown in cross section at locations where air gaps between bit lines are to be formed. Trenches 415a-e are located where bit lines are to be formed (e.g. overlying vias 407a-c). Trenches are shown having a tapered shape so that they are wider at the top than at the bottom. Accordingly, mandrels have an inverted tapered shape so that they are wider at the bottom than at the top. In general, the profile of etched trenches can be selected by tuning the etch process so that a desired profile (such as a tapered profile) may be obtained. Profiles of mandrels are determined by the trenches on either side so that these profiles are also selectable. Sacrificial layer 413 may be formed of a suitable material such as amorphous silicon or photoresist to allow for later removal without damaging adjacent structures.

Figure 5:
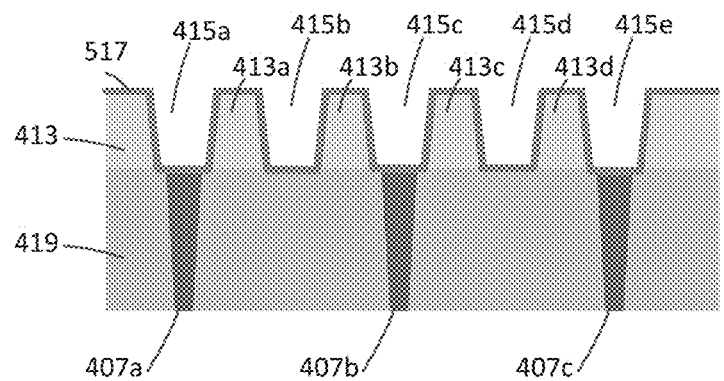
FIG. 5 shows the structure of FIG. 4 after formation of a sidewall layer on mandrels.
Figure 6:
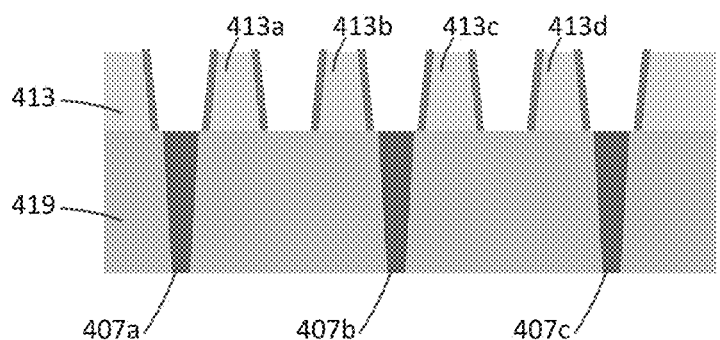
FIG. 6 shows the structure of FIG. 5 after etching back to form sidewalls along sides of mandrels.

FIG. 5 shows the structure of FIG. 4 after deposition of a sidewall layer 517 that extends along sides of mandrels 413a-d (and may also extend along tops of mandrels and bottoms of trenches). Sidewall layer may be formed of a suitable dielectric material such as silicon oxide (e.g. SiO2 or derivatives containing fluorine, carbon, hydrogen), silicon nitride (SiN), silicon oxynitride (SiON), or other suitable material FIG. 6 shows the structure of FIG. 5 after etching back sidewall layer 517 to expose mandrels 413a-d and to expose vias 407a-c. Anisotropic etching (e.g. Reactive Ion Etching "RIE") may be used so that etching removes sidewall layer 517 where it lies substantially perpendicular to the etching direction (perpendicular to the vertical direction in this case, i.e. along a plane parallel to the plane of the substrate). Portions of sidewall layer 517 remain as sidewalls along sides of mandrels 413a-d.

Figure 7:
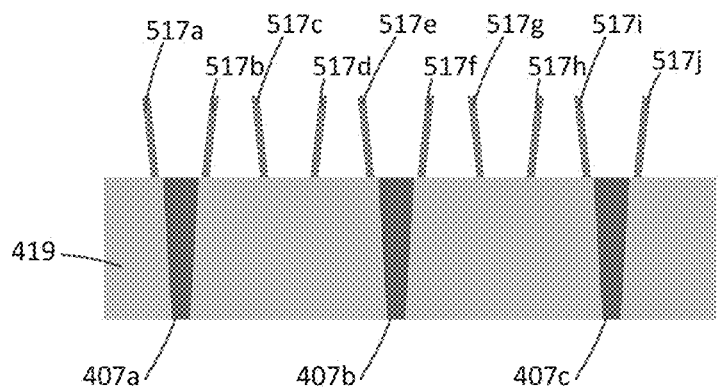
FIG. 7 shows the structure of FIG. 6 after removal of mandrels.

FIG. 7 shows the structure of FIG. 6 after removal of mandrels 413a-d. For example, selective etching using a suitable wet or dry etch may remove amorphous silicon (e.g. wet etching using hot trimethyl-2 hydroxyethyl ammonium hydroxide "TMY"). Photoresist mandrels may be removed by ashing. The areas where mandrels are removed become air gaps.

In some cases, sidewall spacers may tend to collapse because of forces during etching and deposition steps. A sacrificial layer may be formed over sidewall layer 517 FIG. 5 to provide extra physical support during removal of mandrels so that sidewalls 517a -j may have a two layer structure. For example, a sacrificial layer of silicon nitride may be deposited to support silicon oxide sidewalls. The sacrificial layer may later be removed.

Figure 8:
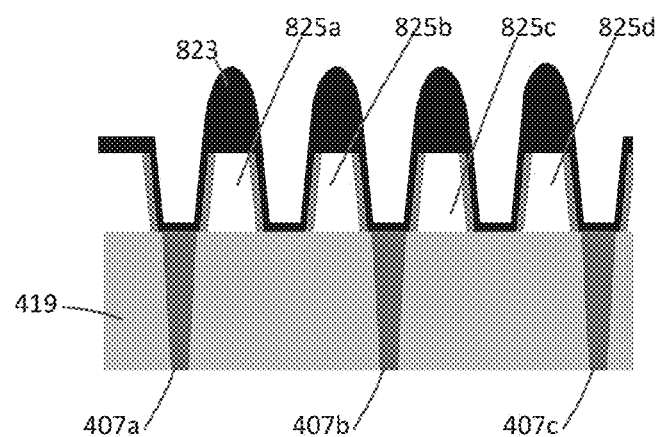
FIG. 8 shows the structure of FIG. 7 after deposition of a capping layer.

FIG. 8 shows the structure of FIG. 7 after formation of a capping layer 823 that encloses air gaps 825a-d. A capping layer may be formed using a suitable process that provides a high deposition rate to pinch off openings such as at the tops of sidewalls. Deposition rates on sides of sidewalls and at bottoms of trenches are lower. This results in the thick caps over air gaps 825a-d as shown.

Figure 9:
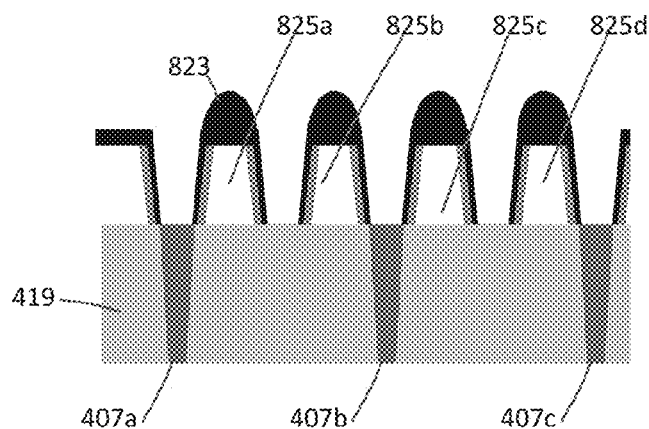
FIG. 9 shows the structure of FIG. 8 after etching back to expose vias.

FIG. 9 shows the structure of FIG. 8 after etching back capping layer 823 to expose vias 407a-c to allow bit lines to contact vias. Capping layer 823 is reduced in thickness over air gaps 825a-d but because of the thickness of capping layer 823 at these locations, air gaps 825a-d remain unexposed and thus are protected from subsequent processing. If a sacrificial layer is used to physically strengthen sidewalls then it may be removed at this stage.

Figure 10:
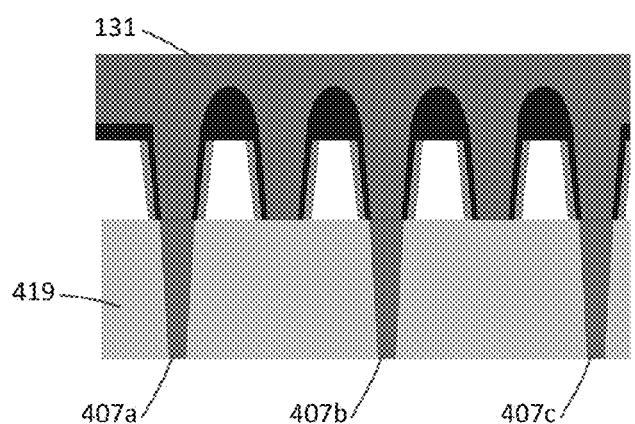
FIG. 10 shows the structure of FIG. 9 after deposition of bit line metal and barrier layer.

FIG. 10 shows the structure of FIG. 9 after deposition of bit line metal 131 and barrier layer (not separately shown). For example, a barrier layer may include one or more of the following materials: titanium (Ti), titanium nitride (TiN), tantalum (Ta), tantalum nitride (TaN). Bit line metal 131 may be copper (Cu), tungsten (W), aluminum (Al), or other metal.

Figure 11:
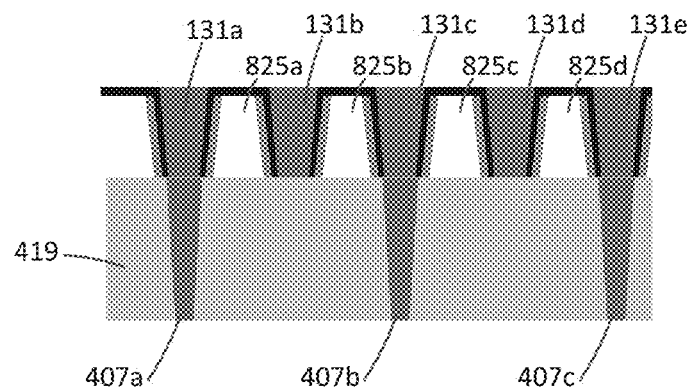
FIG. 11 shows the structure of FIG. 10 after planarization.

FIG. 11 shows the structure of FIG. 10 after planarization to remove excess bit line metal 131. For example, Chemical Mechanical Polishing ("CMP") may be used to remove bit line metal 131 down to a uniform level. This separates bit line metal in different trenches into separate bit lines 131a-e. Bit lines 131a-e have a tapered shape because of the tapered mandrels that established air gap structure shapes. Capping layer material is also removed in this step. However, enough capping layer material remains to maintain air gaps 825a-d intact (i.e. inner volume is not opened to ambient conditions).

Figure 12:
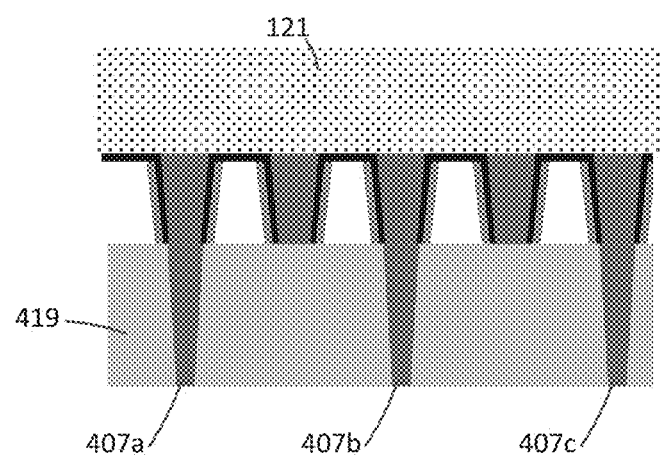
FIG. 12 shows the structure of FIG. 11 after deposition of an interlayer dielectric.

FIG. 12 shows the structure of FIG. 11 after formation of a cover layer 121. This may be a suitable dielectric layer to provide electrical insulation over the bit lines and to protect the bit lines and air gaps from further processing. For example silicon carbon nitride (SiCN) may be used to form such a cover layer.

Figure 13:
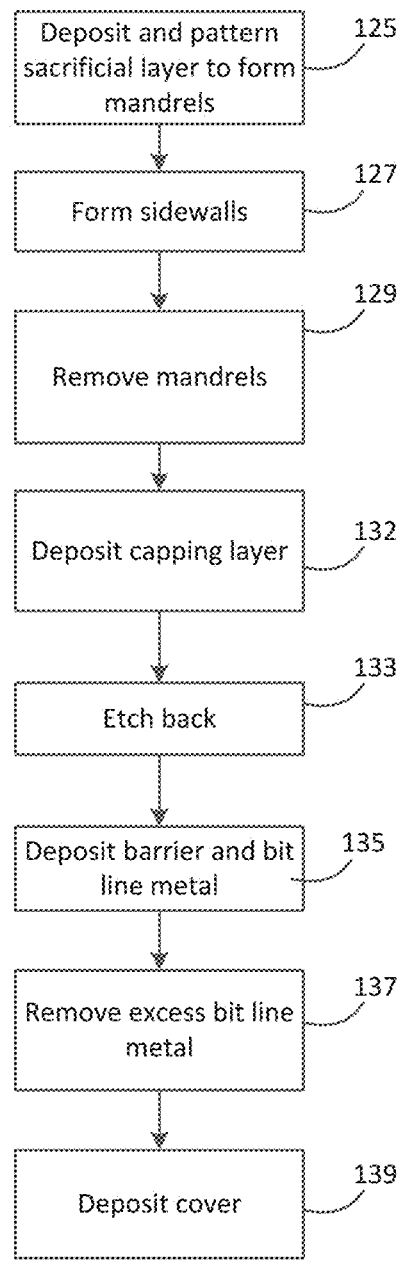
FIG. 13 illustrates steps in the formation of bit lines separated by air gap structures.

FIG. 13 illustrates process steps that may be used to form bit lines separated by air gaps. A sacrificial material such as amorphous silicon or photoresist is deposited and patterned to form core portions, or mandrels 125 that are used to form air gap structures. Mandrels are located where air gaps are to be formed and trenches between mandrels are located where bit lines are to be formed (trenches overlie vias). Sidewalls are formed 127 by depositing and etching back a suitable material such as silicon oxide. Mandrels are then removed 129. A capping layer is then deposited 132, which caps air gaps and protects them from subsequent processing. The capping layer is etched back 133 to expose vias. Then a barrier layer and bit line metal are deposited 135 to fill trenches between air gap structures. Excess material is then removed 137 without exposing air gaps. A cover layer is then deposited 139 for protection.

Different Sized Air Gap Structures

While the above example shows air gap structures that contain a single air gap, larger air gap structures may be formed that contain two or more air gaps. In this way larger patterns may be formed when performing damascene patterning of a metal layer. Wide conductive lines may be formed by leaving wide spaces that are filled with metal. Wide areas without metal may be formed by large air gap structures that contain multiple air gaps close together. Process steps used to form air gap structures can form both smaller and larger structures so that a variety of patterns may be created using a common set of process steps.

Figure 14:
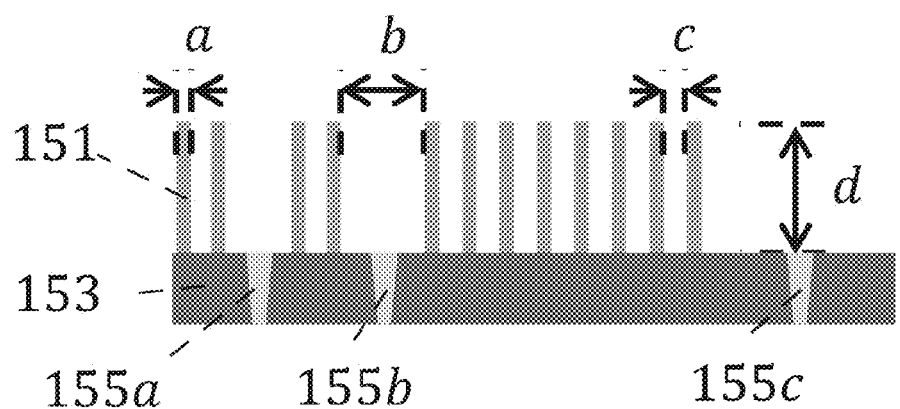
FIG. 14 shows sidewalls with different spacing.

FIG. 14 shows an example of a substrate with parallel lines of dielectric (e.g. line 151 which is a sidewall in this example, but may also be formed by any other suitable patterning method) formed different distances apart to form small and large air gap structures. Sidewalls have a width=a, which may be in the range of three to fifty nanometers (3 nm-50 nm), e.g. 5 nm. Some sidewalls are spaced apart a distance=c which is close enough to ensure that a capping layer encloses an air gap. Mandrels may be formed with a width of about c and may be separated from neighboring mandrels by a distance that is about c to form a series of sidewalls spaced apart from their neighbors on either side a distance c. Generally the distance c is in the range of five to fifty nanometers (5 nm-50 nm), e.g. 10 nm. Other sidewall spacers are spaced apart a distance=b. The distance b is generally more than ten nanometers (>10 nm), e.g. 20 nm. It will be understood that the dimensions are examples and that the sizes of openings that do or do not become capped depends on the process used. All sidewalls have a vertical dimension=d in this example. The dimension d may be thirty to two hundred nanometers (30 nm -200 nm) e.g. 40 nm. Sidewalls may be formed of silicon oxide, for example silicon dioxide (SiO2) formed by CVD using TEOS. Alternatively, sidewalls may be formed of silicon nitride (SiN), silicon oxynitride (SiON), or a modified form of SiO2, for example containing fluorine (F), carbon (C), hydrogen (H), or methyl (CH3). Dielectric layer 153 may be formed of any of these materials or may be formed of silicon carbon nitride (SiCN), porous SiO2, or a suitable low-k dielectric. Vias may be formed of a suitable metal such as tungsten (W), copper (Cu), or aluminum (Al).

Figure 15:
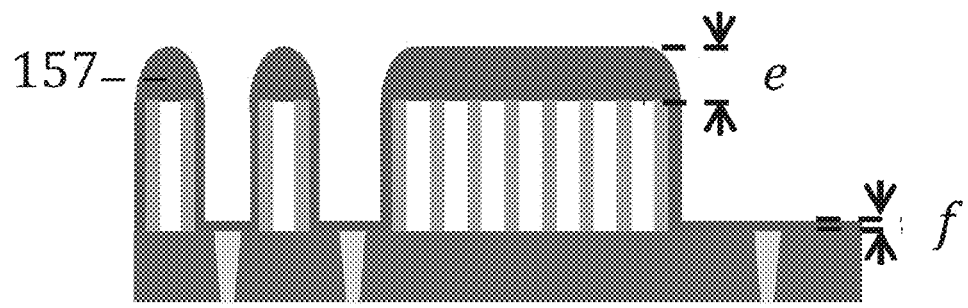
FIG. 15 shows the structure of FIG. 14 with a capping layer.

FIG. 15 shows the structure of FIG. 14 after deposition of a capping layer 157, which may be formed of silicon oxide, e.g. silicon dioxide deposited by plasma CVD using silane (SiH4). Other capping layer materials may also be used including silicon nitride (SiN), silicon carbon nitride (SiCN), and alternative forms of silicon oxide such as porous SiO2, or SiO2 with fluorine (F), carbon (C), hydrogen (H), or methyl (CH3). High growth rate of provides capping layer thickness=e over air gap structures. Lower growth rate on dielectric layer produces a capping layer thickness=f, which is less than e. For example, thickness e may be in the range of ten to fifty nanometers (10 nm-50 nm), e.g. 30 nm. Dimension f may be in the range of two to twenty nanometers (2 nm-20 nm), e.g. 5 nm.

Figure 16:
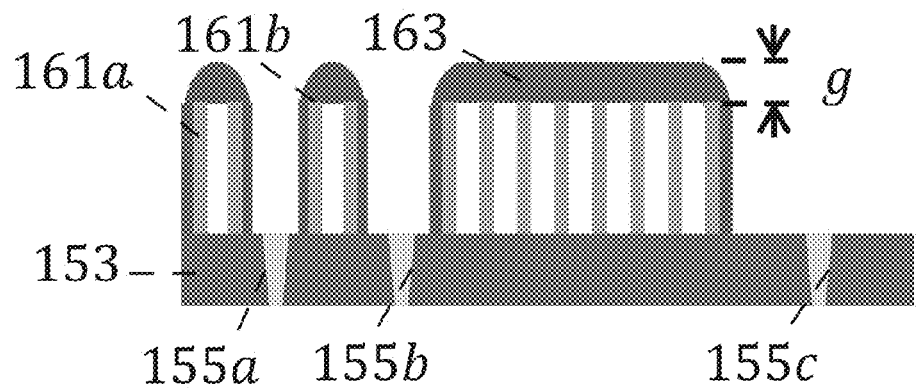
FIG. 16 shows the structure of FIG. 15 after etching back.

FIG. 16 shows the structure of FIG. 15 after etching back to remove some capping layer material so that the dielectric layer 153 and vias 155a-c are exposed. Etching back may be sufficient to remove a thickness greater than or equal to f so that exposure of vias is ensured (i.e. some over-etching may be used to ensure that no capping layer material remains over vias). Thus, remaining thickness of capping layer material over air gap structures, dimension=g, is generally somewhat less than e-f (g<e−f). For example, dimension g may be ten to forty nanometers (10 nm-40 nm), e.g. 25 nm. Both small air gap structures 161a-b and larger air gap structure 163 are formed at this stage.

Figure 17:
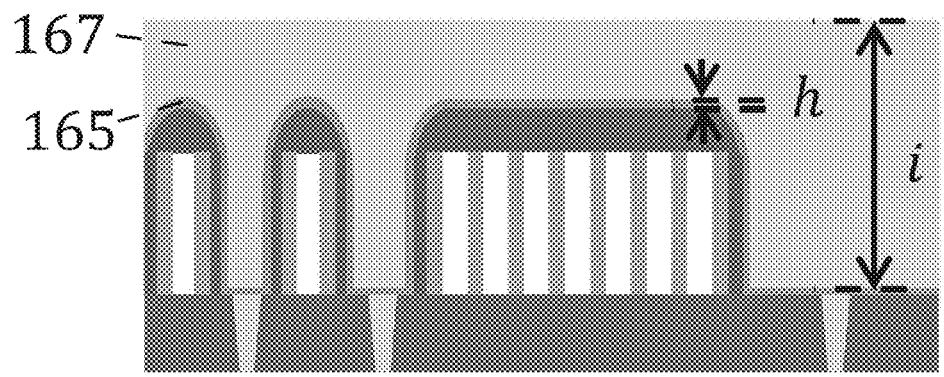
FIG. 17 shows the structure of FIG. 16 after deposition of bit line metal and a barrier layer.

FIG. 17 shows the structure of FIG. 16 after deposition of a barrier layer 165 and bit line metal 167. Barrier layer 165 may be formed of a suitable material including, but not limited to, one or more of: titanium (Ti), titanium nitride (TiN), tantalum (Ta), tantalum nitride (TaN), ruthenium (Ru). Bit line metal may be copper (Cu), tungsten (W), aluminum (Al), or other suitable metal. A barrier layer may be deposited to a thickness of one to five nanometers (1-5 nm), e.g. 2 nm. Bit line metal may be deposited to a thickness of one hundred to one thousand nanometers (100 nm-1000 nm), e.g. 300 nm.

Figure 18:
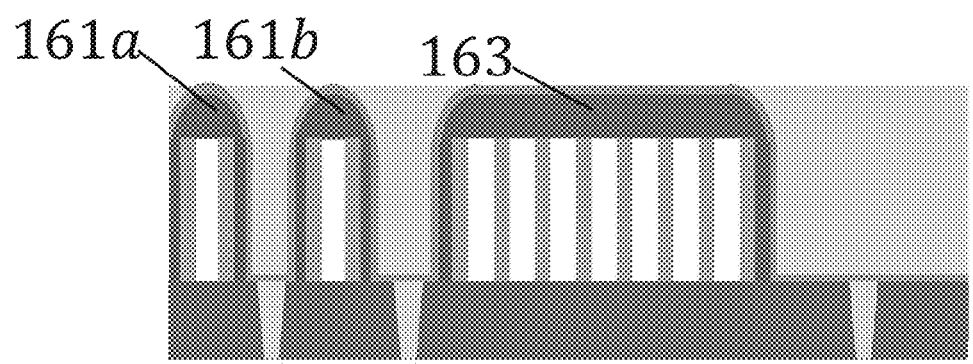
FIG. 18 shows the structure of FIG. 17 after planarization.

FIG. 18 shows the structure of FIG. 17 after CMP to remove excess bit line metal. CMP may stop at the barrier layer 165 over air gap structures (e.g. using end-point detection). Bit line metal is separated into separate bit lines in this step. Other conductors may also be formed where larger open spaces remain between air gaps. While small single air gap structures 161a-b separate bit lines, larger multi air gap structures (e.g. air gap structure 163) provide larger areas without metal.

Figure 19:
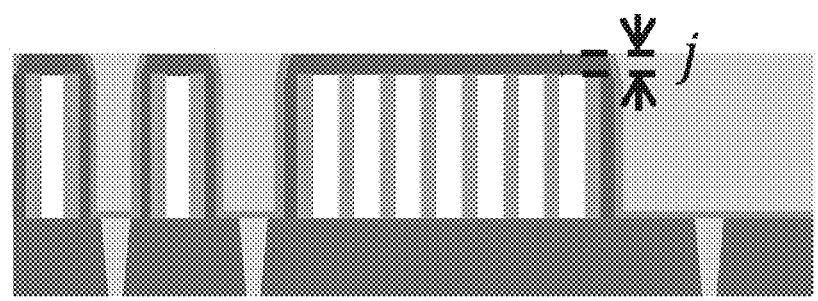
FIG. 19 shows the structure of FIG. 18 after removal of additional material.

FIG. 19 shows the structure of FIG. 18 after a subsequent CMP step to remove additional material including barrier layer material, capping layer material, and bit line metal. The remaining thickness of capping layer=j in this example, where j is sufficient to ensure that air gaps are not exposed. For example, dimension j may be five to thirty nanometers (5 nm-30 nm), e.g. 10 nm.

Figure 20:
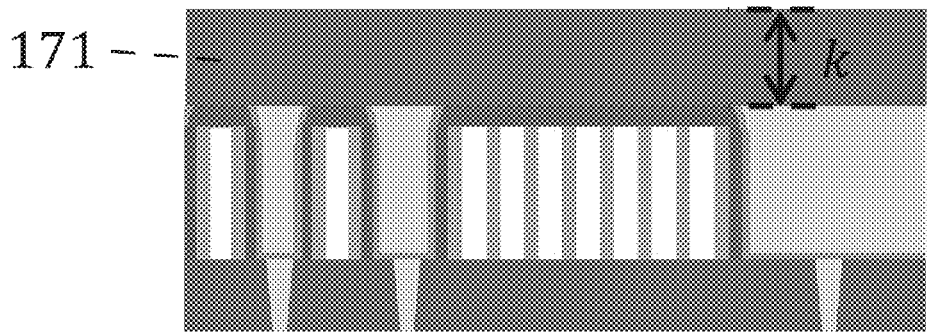
FIG. 20 shows the structure of FIG. 19 after deposition of an interlayer dielectric.

FIG. 20 shows the structure of FIG. 19 after deposition of an interlayer dielectric layer 171 over the bit lines and air gap structures. Interlayer dielectric layer 171 may be formed of any suitable material, for example one or more of: silicon carbon nitride (SiCN); silicon carbide (SiC); silicon nitride (SiN); various forms of silicon oxide including porous SiO2 and SiO2 containing fluorine (F), carbon (C), hydrogen (H), methyl (CH3); or other low-k dielectric materials.

Conclusion

Although the various aspects have been described with respect to examples, it will be understood that protection within the full scope of the appended claims is appropriate.

It is claimed:

1. A method of forming air gaps in an integrated circuit comprising:
   forming a plurality of parallel lines of dielectric of equal height on a first layer of dielectric;
   the plurality of parallel lines defining first regions where no conductive material is to be located, a distance between adjacent lines in the first regions being smaller than a predetermined distance;
   the plurality of parallel lines defining second regions where conductive material is to be located, a distance between adjacent lines in the second regions being larger than the predetermined distance;
   subsequently, depositing a second layer that caps air gaps between lines in the first regions that are less than the predetermined distance apart and that deposits the second layer on the first layer of dielectric in the second regions where adjacent lines are more than the predetermined distance apart;
   subsequently removing the second layer in the second regions to expose the surface of the first layer;
   subsequently depositing barrier metal and conductive material across the first and second regions; and
   subsequently planarizing to expose the second layer in the first regions and to form individual lines of conductive material in the second regions.

2. The method of claim 1 wherein the forming of the plurality of parallel lines comprises:
   forming a third layer on the first layer of dielectric, the third layer formed of a material with a lower etching rate than the first layer;
   patterning the third layer to form core portions;
   depositing a fourth layer on top surfaces of the core portions, side walls of the core portions, and on a surface of the first layer;
   etching back the fourth layer to remove the fourth layer from the top surfaces of the core portions to expose the top surfaces of the core portions and to remove the fourth layer from the surface of the first layer; and
   removing the core portions while maintaining the fourth layer that was deposited on the sidewalls of the core portions.

3. The method of claim 2 wherein the core portions have a tapered shape with bottom surface in contact with the first layer of dielectric, the bottom surface being wider than the top surface.

4. The method of claim 1 wherein the forming of the plurality of parallel lines comprises:
   forming a third layer on the first layer of dielectric;
   forming a mask pattern on the third layer using a lithography process; and
   forming the plurality of line patterns from the third layer by patterning the third layer using the mask pattern and an anisotropic etch process.

5. The method of claim 1 wherein the second layer has a first thickness in the first regions and a second thickness in the second regions, the first thickness being greater than the second thickness.

6. The method of claim 1 wherein the bather metal is a metal that has a significant etch rate when etching dielectric material.

7. The method of claim 6 wherein the barrier metal is titanium.

8. The method of claim 1 wherein the planarizing exposes the second layer in the first regions where the second layer overlies air gaps, and wherein the planarizing does not expose the air gaps.

9. A method of forming metal lines in an integrated circuit comprising:
   forming a plurality of air gap mandrels on a dielectric layer;
   fanning sidewalls on the plurality of air gap mandrels;
   subsequently, removing the plurality of air gap mandrels;
   subsequently, depositing a capping layer to enclose a plurality of air gaps where the plurality of air gap mandrels were removed; and
   subsequently depositing bit line metal to form a plurality of bit lines at locations between the plurality of air gaps.

10. The method of claim 9 further comprising forming large areas without metal by forming a plurality of elongated closely-spaced air gap mandrels in the large areas so that the capping layer forms a continuous covering over tops of sidewalls formed on the plurality of elongated closely-spaced air gap mandrels.

11. The method of claim 10 further comprising enclosing additional air gaps in the large areas, the additional air gaps formed between sidewalls formed on neighboring mandrels of the plurality of elongated closely-spaced air gap mandrels.

12. The method of claim 11 further comprising, prior to depositing the bit line metal, etching back the capping layer to remove the capping layer at locations where the capping layer is in contact with the dielectric layer without exposing the plurality of air gaps or the additional air gaps.

13. The method of claim 9 further comprising planarizing the bit line metal to separate bit lines at locations between the plurality of air gaps.

14. The method of claim 13 wherein the planarizing of the bit line metal to separate bit lines also planarizes the capping layer and the planarizing stops at a level above the plurality of air gaps so that air gaps remain enclosed.

15. The method of claim 13 wherein, subsequent to depositing the bit line metal to form the plurality bit lines, the bit liens are not exposed to any etching.

\* \* \* \* \*